United States Patent [19]

Mimura et al.

[11] Patent Number: 4,535,228

[45] Date of Patent: Aug. 13, 1985

[54] HEATER ASSEMBLY AND A HEAT-TREATMENT METHOD OF SEMICONDUCTOR WAFER USING THE SAME

[75] Inventors: Yoshiki Mimura, Yokohama; Tetsuji Arai, Tachikawa; Hiroshi Shimizu, Yokohama; Satoru Fukuda, Kawasaki, all of Japan

[73] Assignee: Ushio Denki Kabushiki Kaisha, Tokyo, Japan

[21] Appl. No.: 539,413

[22] Filed: Oct. 6, 1983

[30] Foreign Application Priority Data

Dec. 28, 1982 [JP] Japan .................................. 57-227534
Dec. 28, 1982 [JP] Japan .................................. 57-227535

[51] Int. Cl.³ ...................... F27D 11/00; H05B 1/00; C23C 13/08
[52] U.S. Cl. .................................. 219/411; 219/405; 219/354; 118/725
[58] Field of Search .................. 219/405, 411, 354; 118/724, 725, 728, 50.1

[56] References Cited

U.S. PATENT DOCUMENTS

| 983,292 | 2/1911 | Kohn | 219/443 |
|---|---|---|---|
| 3,395,266 | 7/1968 | Price | 219/443 |
| 3,471,326 | 10/1969 | Kappelmeyer | 118/725 |
| 3,539,759 | 11/1970 | Spiro | 118/725 |
| 3,836,751 | 9/1974 | Anderson | 219/411 |
| 4,101,759 | 7/1978 | Anthony | 219/405 |
| 4,113,547 | 9/1978 | Katz | 118/725 |
| 4,339,645 | 7/1982 | Miller | 118/50.1 |

Primary Examiner—Roy N. Envall, Jr.
Assistant Examiner—Teresa J. Walberg
Attorney, Agent, or Firm—Ziems, Walter & Shannon

[57] ABSTRACT

Disclosed herein are a heater assembly and a method for heat-treating a semiconductor wafer using the same. The heater assembly is formed of a heating device having a ring-shaped portion and a holder combined with the heating device detachably each other. A wafer material such as a semiconductor wafer is held on the holder of the heater assembly. A heat-treatment is effected by heating the wafer material by means of application of light radiated from a light source, which is formed of one or more lamps, while heating or after having heated the circumferential portion of the wafer by the heating device of the heater assembly. Owing to the subsidiary heating of the circumferential portion, the wafer may be heat-treated at substantially the same temperature in its entirety. Thus, the heat-treatment does not develop such large "warping" impairing subsequent treatment and/or treatment of the wafer or "slip lines". The heater assembly may be used successfully and conveniently in effecting uniform heating. The detachable structural feature of the holder facilitates its cleaning and this is effective in keeping the atmosphere of the irradiation space always clean.

6 Claims, 5 Drawing Figures

HEATER ASSEMBLY AND A HEAT-TREATMENT METHOD OF SEMICONDUCTOR WAFER USING THE SAME

BACKGROUND OF THE INVENTION (1) Field of the Invention

This invention relates to a heater assembly and a heat-treatment method of a semiconductor wafer using the heater assembly, and more specifically to a heater assembly for holding a wafer material or planar material and heating the circumferential portion thereof, and to a method for heat-treating a semiconductor wafer using the heater assembly by application of radiated light while additionally heating the circumferential portion of the semiconductor wafer by a heating device of the heater assembly. The circumferential portion of the semiconductor wafer may alternatively be heated in advance by the heating device of the heater assembly.

(2) Description of the Prior Art

The ion implantation process has recently been finding actual utility as an effective method for introducing dopant atoms into a semiconductor wafer (hereinafter may be called "wafer" for the sake of brevity) since it is possible to control accurately the concentration levels of dopant atoms and the depths of resulting junctions. In the ion implantation process, the dopant atoms are ionized and accelerated to high velocity and the wafer is bombarded with the dopant atoms. Whenever the ion implantation process is carried out, it is necessary to subject each resulting wafer to a subsequent heating treatment at about 1000° C. or higher so that any crystal defects which have been developed due to changes in crystalline state at the surface of the wafer can be healed to ensure desired surface conditions. This heat treatment must be carried out in a short time period so as to prevent the concentration disbribution of the implanted dopant atoms in the depthwise direction of the wafer from changing due to thermal diffusion. Furthermore, there is an outstanding demand for the establishment of a high-speed heating and cooling cycle for wafers in order to improve their productivity.

Reflecting the above-mentioned demands, a novel method has recently been developed to heat a wafer by means of application of radiated light. According to such a method, the temperature of wafer may be raised to some hundred degree above 1000° C. in a time period as short as a few seconds.

It has however been found that, when a wafer, for example, a wafer of single crystal of silicon is heated to a treatment temperature of about 1150° C. or so in a short time period of not longer than a few seconds and is then held at that treatment temperature by means of mere application of radiated light so as to carry out its heat-treatment, a relatively large temperature difference occurs between the circumferential portion of the wafer and its central portion in the course of the heat-raising and heat-treatment step, whereby developing such large "warping" as impairing subsequent treatment and/or processing steps and also a damage called "slip line" in the wafer.

The thickness of a wafer is generally very small, namely, of a level of about 0.5 mm or so and its thicknesswise temperature distribution is thus rendered substantially uniform in a very short time period of a level of $10^{-3}$ second or so. Accordingly, a wafer is not practically affected adversely by any thicknesswise non-uniform temperature distribution. The above-mentioned "warping" or "slip line" is hence caused by the non-uniform temperature distribution in the direction extending along the surfaces of the wafer. Namely, the temperature of the wafer is kept considerably lower at its circumferential portion compared with its central portion, because even if the surfaces of the wafer are heated with a uniform radiant energy density by means of application of radiated light, far more heat is allowed to radiate off from the circumferential portion of the wafer than its central portion and the temperature of the circumferential portion cannot thus follow that of the central portion of the wafer when the temperature of the wafer is raised and the former temperature cannot reach the latter temperature even during the heat treatment of the wafer.

If a wafer develops such large "warping", some problems will be encountered in its subsequent treatment and/or processing steps, including for example that a pattern image may be distorted in the photoetching treatment step. On the other hand, the occurrence of "slip line" makes it impossible to use the wafer as a semiconductor material, in other words, destroys its value and, accordingly, leads to a fatal loss.

With a view toward overcoming such problems, a method has been proposed to additionally or precedingly heat a circumferential portion of a wafer. According to the method, one or both surfaces of a wafer are heated by means of application of light radiated from one or more radiant light sources such as halogen lamps either while heating a circumferential portion of the wafer by a subsidiary heater such as lamp or resistive heater or after having heated the circumferential portion by the subsidiary heater.

SUMMARY OF THE INVENTION

An object of this invention is therefore to provide a heater assembly which can hold a wafer material to be heat-treated in a desired state for heat-treatment by application of radiated light and can heat successfully and conveniently the circumferential portion of the wafer to control or to reduce the heat radiating off therefrom.

Another object of this invention is to provide a heat-treatment method of a semiconductor wafer using the heater assembly by means of application of radiated light while additionally heating or after having heated the circumferential portion of the wafer by the heating device of the heater assembly, which method permits to draw out sufficient effects by the additional heating and thus to achieve a uniform heat-treatment of the semiconductor wafer.

In one aspect of this invention, there is thus provided a heater assembly comprises:

a holder on which a wafer material to be heat-treated is held by gravity in contact therewith and a heating device combined detachably with the holder, which heating device heats principally the circumferential portion of the wafer.

In another aspect of this invention, there is provided a method for heat-treating a semiconductor wafer, which method comprises:

providing a heater assembly as mentioned above;

mounting and holding a semiconductor wafer to be heat-treated on the holder of the heater assembly in contact therewith at least at three contact points of small area on the surface of the wafer; and heating the semiconductor wafer by means of application of radiated light while heating or after having heated the circumferential portion of the wafer by the heating device of the heater assembly;
all of said contact points are at positions which are apart inwardly by at least 1 mm from the circumferential edge of the semiconductor wafer.

The above objects of this invention have been achieved by the above-described heater assembly and heat-treatment method.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
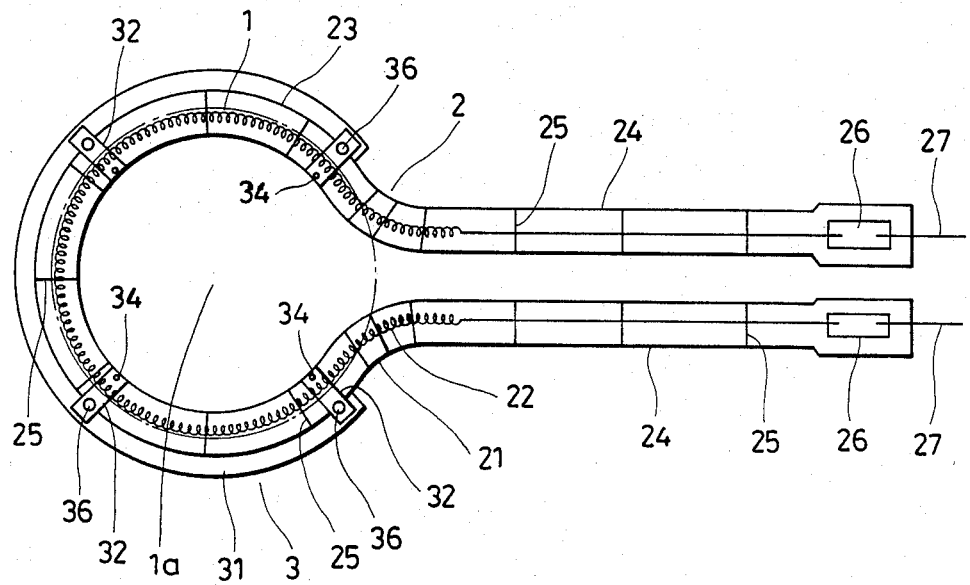
FIG. 1 is a top plan view of one example of the heater assembly according to this invention.
Figure 2:
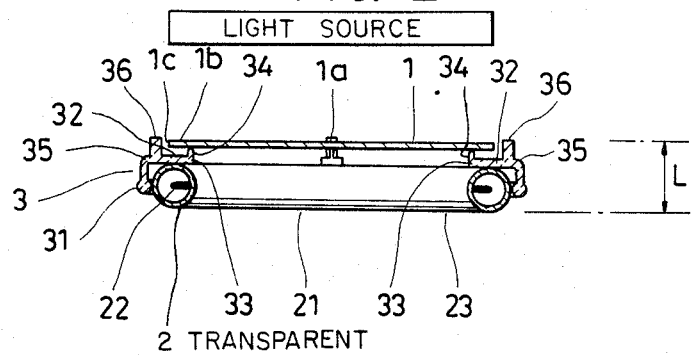
FIG. 2 is a cross-sectional front elevation of the heater assembly of FIG. 1 upon which a semiconductor wafer to be heat-treated is held.

FIG. 1 is a top plan view of a heater assembly according to this invention and used desirably in the practice of this invention, whereas FIG. 2 is a cross-sectional view of the heater assembly on which a wafer, which is to be heat-treated, has been placed. Although not shown in FIG. 2, planar light sources, each formed of 12 tubular halogen lamps—each of 1150 W rated power consumption—arranged side by side and in parallel to one another in a common plane, are respectively arranged above and below a wafer 1. Owing to the provision of the planar light sources, the radiant energy density becomes uniform on both surfaces of the wafer 1. The wafer 1 is heated by means of application of light radiated from the planar light sources in such a way that the surface temperature of the wafer 1 reaches about 1150° C. at a central portion 1a of the wafer 1. The total power consumption of the planar light sources for the irradiation of radiant light therefrom reaches about 28 KW. The wafer 1 is for example a disk of semiconductor material of 4 inches in diameter and 0.4 mm in thickness. It may for example be formed of a single crystal of silicon in which boron, a dopant, has been implanted by the ion implantation method.

Numeral 2 indicates a heating device which functions as a subsidiary heating means for additional or preceding heating of the wafer while said planar light sources funtion as a main heating means. The heating device 2 is comprised of a lamp such as a halogen lamp or infrared lamp in this example, having a long envelope 21 made of silica glass tube, which envelope comprises a ring-shaped portion 23 and positioning arms 24, 24 extending in the same direction respectively in one direction outwards from both ends of the ring-shaped portion 23. In the envelope 21, a filament 22 which serves as a light-emitting member is provided along the axis of the ring-shaped portion 23 of the envelope 21. The end sections of the filament 22, which end sections are located respectively whithin the arms 24, 24 of the envelope 21, are internal leads and do not emit light. Numeral 25 indicates filament supports. Numeral 26 indicates metal foils made of molybdenum or the like and sealed at the end portions of the envelope 21. Designated at numeral 27 are external leads. The heating device 2 is disposed right below the lower surface of the wafer 1 so that it heats the circumferential edge 1c and the circumferential portion 1b of the wafer principally.

Designated at numeral 3 is a holder for the wafer 1, which holder makes up a heater assembly in combination with the heating device 2. The holder 3 is constructed of an arcuate ring-like portion 31 elongating along a circular arc so as to surround the outer circumferential face of the ring-shaped portion 23 of the envelope 21 at the outside thereof while being kept in contact with the outer circumferential surface of the ring-shaped portion 23, supporting and engagement portions 32 formed respectively as integral members, for example, at four locations on the arcuate ring-like portion 31 and extending from the upper part of the arcuate ring-like portion 31 inwardly so that they contact at their under surface with the upper surface of the ring-shaped portion 23 of the envelope 21 of the heating device 2, projections 34 extending upwards from, for example, the inner end portions 33 of their respective supporting and engagement portions 32, and wafer displacement-preventive stoppers 36 provided at the outer end portions 35 of the supporting and engagement portions 32. The holder 3 is formed as a single unit in its entirety, for example, with silica glass and has high light-transmissive property. The holder 3 is horizontally held in place by its own weight as the four supporting and engagement portions 32 are hooked on the upper surface of the envelope 21. The holder is also held in place in the horizontal plane, because the arcuate ring-like portion 31 surrounds the circumference of the ring-shaped portion 23 in such a manner that the arcuate ring-like portion 31 is kept in contact with the circumference of the ring-shaped portion of the envelope in every radial direction thereof. Thus, the holder 3 and the heating device 2 are combined detachably from each other.

According to the invention, using a heater assembly having such a structure as mentioned above, the heat-treatment of the wafer 1 is carried out in the following manner. Namely, the wafer 1 is held in place by gravity by the four projections 34 of the holder 3 at contact points of very small area on the lower surface thereof. The positions of the wafer 1 at which the projections 34 contact may preferably be selected so that the contact points are at positions apart inwardly by at least 1 mm from the circumferential edge 1c of the wafer 1. Then, the wafer 1 is heated by application of light radiated from the planar light sources thereby effecting main heating. Simultaneously with or prior to the main heating, an electric power controlled in magnitude within the range of from 400 W to 1400 W is fed to the heating device 2 of the heater assembly so as to turn on the same, for subsidiary heating. The circumferential portion 1b of the wafer 1 is thus additionally heated or precedingly heated by the heating device 2 so that the temperature at the circumferential portion 1b of the wafer becomes substantially equal to that of the envelope wall of the heating device 2 in the temperature range over about 500° C.

According to the above heating method, the main heating of the wafer 1 is effected by the irradiation of light onto both surfaces of the wafer 1 from both upper and lower planar light sources. Owing to the provision of the heating device 2 of the heater assmebly in accordance with the present invention for subsidiary heating, the circumferential portion 1b of the wafer 1 is additionally or precedingly heated. As a result, the temperature difference between the central portion 1a and the circumferential portion 1b of the wafer 1 is extremely minimized, thereby making the temperature of the wafer 1 uniform therethroughout. Consequently, the additional heating or preceding heating by the heating device 2 of the heater assembly can avoid occurrence of such large "warping" as impairing subsequent treatment and/or processing and also development of "slip line". In the heater assembly, since the holder 3 is provided separably from the heating device 2, it is easy to take out the holder 3 only for its cleaning. Thus, the sticking problem of dust or stain on the wafer 1 can be substantially avoided by cleaning the holder 3 as needed. This also permits to prevent the pollution of the light irradiation atmosphere. As a result, the wafer 1 can be heat-treated under superior conditions. In addition, the heating device 2 and the holder 3 which construct altogether the heater assembly may be replaced independently and solely by their fresh replacements. Compared with a heater assembly in which its heating device and holder are fixed as an integral unit and are hence unseparable from each other, the heater assembly according to this invention requires a lower cost for its parts replacement and is thus economical.

Where the heating device 2 of the heater assembly is provided with the positioning arms 24, 24 as in the above-described embodiment, an automatic positioning mechanism may be readily provided to advance or retreat the heater assembly of this invention into or from the irradiation space defined by the planar light sources for main heating. It is generally required not to advance any structural parts of such an automatic positioning mechanism into the irradiation space defined by the planar light sources, because the atmosphere of the irradiation space must generally be kept clean and the radiant light is not supposed to be blocked. The heater assembly of this invention, however, permits to position the wafer held on the heater assembly without positioning any foreign material in the irradiation space by making use of the lengths of the arms 24, 24. Accordingly, it is not necessary to use any automatic positioning mechanism of a special structure but an automatic positioning mechanism of a simple structure may work satisfactorily. As mentioned above, it is preferred to hold the wafer 1 at the contact points of very small area which are respectively located at least 1 mm inside from the circumferential edge 1c of the wafer 1 toward the center thereof. Although heat of the wafer 1 may be allowed to drain at the contact points of the projections 34 of the holder 3 due to the thermal conduction, the temperature drop due to the drainage of heat is minimal and does not induce occurrence of "warping" or "slip line".

In the above embodiment, it is preferred to make the height L of the heater assembly as small as possible. This permits to make the area of the opening of the irradiation space defined by the planar light sources smaller, thereby allowing to conduct a stable heat-treatment without disturbing the state of the atmosphere in the irradiation space. In order to ensure the stable holding of the wafer 1, it is necessary to support the wafer 1 by the holder 3 at least three contact points of very small area. From the practical viewpoint, it is preferred that each of the contact points of the wafer 1 is 0.5 $mm^2$ or smaller. The configurations of the projections 34 of the holder 3 may vary in various ways. They may each be formed into a shape bent in its entirety, or rounded or pointed at its free end portion. The heating device 2 of the heater assembly is not necessarily limited to that employed in the above embodiment. For example, the heating device 2 may be made of resistive metal which radiates heat upon feeding the electric power thereto. Further, the heating device is not limited to heating devices of the self heat-generating type only. For example, the heating device 2 may be made of a metal having a high fusing point, the temperature of which metal increases upon exposure to radiant light from the light source for main heating.

Figure 3:
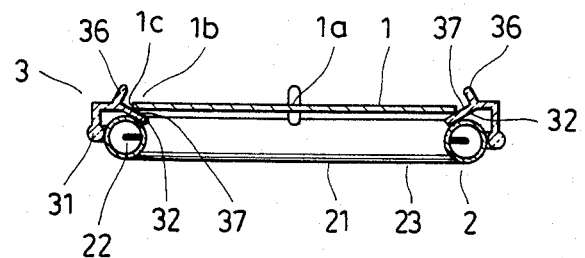
FIG. 3 is a fragmentary cross-sectional front elevation showing another example of the heater assembly according to this invention.
Figure 4:
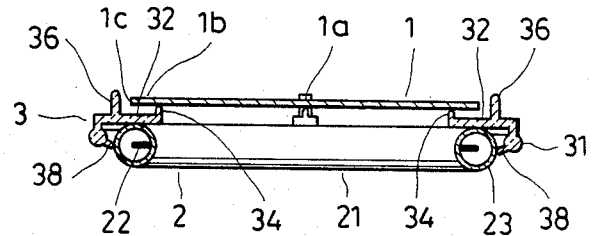
FIG. 4 is a frangmentary cross-sectional front elevation showing a further example of the heater assembly according to this invention.
Figure 5:
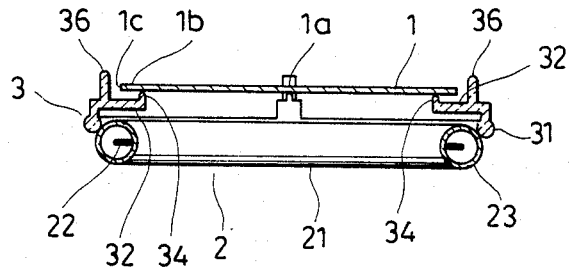
FIG. 5 is a frangmentary cross-sectional front elevation showing a still further example of the heater assembly according to this invention.

The structure of the holder 3 may also be varied. For example, as illustrated in FIG. 3, it may be feasible to hold the circumferential edge 1c of the wafer 1 by oblique faces 37 without providing any projections with the holder 3 for supporting the wafer 1. The oblique faces 37 can be provided by forming the supporting and engagement portions 32 in such a way that their free end portions become downwardly aslant. Furthermore, it may be radially held in place, as illustrated in FIG. 4, by providing projecting leg portions 38 without bringing the arcuate ring-like portion 31 into direct contact with the ring-shaped portion 23 of the heating device 2. The holder 3 may be held in place in both up-and-down and radial directions by, as depicted in FIG. 5, allowing only the ring-like portion 31 to contact the upper shoulder portion of the tube at the ring-shaped portion 23 without bringing the supporting and engagement portions 32 into direct contact with the ring-shaped portion 23 of the heating device 2.

The heater assembly of this invention may be used preferably and conveniently to various heat-treatment processes of wafer materials to which effecting uniform heating is needed, and the method of this invention may be applied widely, for example, to various steps in the fabrication of semiconductor devices which steps require heating, including for example the dopant diffusion step, chemical vapor deposition step, heat treatment step for electrical activation, and heat-treatment step for oxidizing a surface layer of a silicon wafer.

EXPERIMENT

A heat treatment of a semiconductor wafer of single crystal silicon was conducted in accordance with the method described before using the heater assembly as shown in FIGS. 1 and 2, namely, by holding the wafer 1 on the holder 3 in such a way that each of the projections 34 of the holder 3 contacted with the wafer 1 at contact points each of which positions 2 mm inside from the circumferential edge 1c of the wafer 1 and then heating the wafer 1 by means of application of light radiated from the planar light sources while feeding an electric power of 1000 W to the heating device 2. Even when the wafer 1 was subjected to a heat-treatment for a relatively long time period, namely, for 60 seconds or longer, the temperature of the wafer 1 reached about 1150° C. at the central portion 1a and about 1120° C. at circumferential portion 1b including the circumferential edge 1c. Although the temperatures of the circumferential portion 1b were still slightly lower than the temperature of the central portion 1a as indicated above, the wafer 1 was successfully heat-treated without developing such large "warping" as impairing subsequent treatment and/or processing or "slip line". For the sake of comparison, a heat treatment was carried out without any subsidiary heating, i.e. without the additional heating by the heating device 2 and by holding the wafer 1 on the holder 3 in such a way that the projections 34 of the holer 3 were kept in contact with the wafer 1 at contact points apart less than 1 mm from the circumferential edge of the wafer 1. By effecting the heat treatment even for only 7 seconds, many "slip lines" occurred from the circumferential edge 1c to the circumferential portion 1b, whereby destroying the value of the wafer 1. In addition, a further heat-treatment was also carried out while applying the subsidiary heating by the heating device 2 in the same manner as in the above experiment but by holding the wafer on the holder 3 in such a way that the projections 34 of the holder 3 were kept in contact with the wafer 1 at contact points apart less than 1 mm from the circumferential edge of the wafer 1. When the heat-treatment was applied for 25 seconds or longer, some "slip lines" were developed from the circumferential edge 1c to the circumferential portion 1b.

Having now fully described the invention, it will be apparent to one of ordinary skill in the art that many changes and modifications can be made thereto without departing from the spirit or scope of the invention as set forth herein.

What is claimed is:

1. A heater assembly for heating a wafer to a uniform temperature in association with heating of the wafer by application of radiated light comprising:
    a holder on which the wafer to be heat-treated is to be held in contact by gravity and means for heating principally a circumferential portion of the wafer, said means for heating including a heating device combined detachably with the holder, wherein the heating device has an elongated positioning arm which extends in one direction.

2. A heater assembly comprising:
    a holder on which a wafer material to be heat-treated is to be held in contact by gravity and a heating device combined detachably with the holder for heating principally a circumferential portion of the wafer, wherein the holder is made of silica glass as a single unit in its entirety and has an arcuate ring-like portion elongated along a circular arc, a plurality of supporting and engagement portions are formed on the ring-like portion and engage with the heating device for supporting the holder on the heating device, and projections on which the wafer material is to be held by gravity are formed on the supporting and engagement portions.

3. A method for heat-treating a semiconductor wafer having a surface, a circumferential portion and a circumferential edge, which method comprises:
    providing a heater assembly having a heating device and a holder;
    mounting and holding a semiconductor wafer to be heat-treated in contact with the holder of the heater assembly at least at three contact points of small area on the surface of the wafer, said contact points being positioned inward by at least 1 mm from the circumferential edge of the wafer;
    heating by said heating device principally at least one of said circumferential edge and said circumferential portion; and
    heating the semiconductor wafer by application of radiated light in association with said heating by said heating device.

4. The method as claimed in claim 3, wherein the area of each contact point is no greater than 0.5 mm$^2$.

5. The method as claimed in claim 3, wherein said heating of the semiconductor wafer by means of application of radiated light is performed while said heating by said heating device is performed.

6. The method as claimed in claim 3 wherein said heating of the semiconductor wafer by means of application of radiated light is performed after said heating by said heating device is performed.

* * * * *